United States Patent [19]

Bradshaw et al.

[11] Patent Number: 5,729,149

[45] Date of Patent: Mar. 17, 1998

[54] APPARATUS FOR HOLDING A TESTING SUBSTRATE IN A SEMICONDUCTOR WAFER TESTER AND METHOD FOR USING THE SAME

[75] Inventors: Richard S. Bradshaw; Kenneth E. Adams, both of Austin; Cyrus M. Earl, Austin; Curtis H. Youngblood, Georgetown, all of Tex.

[73] Assignee: Motorola, Inc., Schaumburg, Ill.

[21] Appl. No.: 536,825

[22] Filed: Sep. 29, 1995

[51] Int. Cl.⁶ ................................................ G01R 31/02
[52] U.S. Cl. ........................................ 324/758; 324/754
[58] Field of Search ............................. 324/754, 755, 324/758, 761; 439/482

[56] References Cited

U.S. PATENT DOCUMENTS

| | | | |
|---|---|---|---|
| 4,138,186 | 2/1979 | Long et al. | 324/754 |
| 4,812,754 | 3/1989 | Tracy et al. | 324/754 |
| 4,829,241 | 5/1989 | Maelzer | 324/754 |
| 5,055,777 | 10/1991 | Bonelli et al. | 324/754 |
| 5,172,053 | 12/1992 | Itoyama | 324/158 |
| 5,325,052 | 6/1994 | Yamashita | 324/754 |
| 5,436,567 | 7/1995 | Wexler et al. | 324/754 |
| 5,546,012 | 8/1996 | Perry et al. | 324/754 |

*Primary Examiner*—Ernest F. Karlsen
*Assistant Examiner*—Anh Phung
*Attorney, Agent, or Firm*—Patricia S. Goddard; Jeffrey S. Abel

[57] ABSTRACT

An apparatus(19) for holding a testing substrate in a wafer prober (16) has a plate (34) hinged to a head stage (18) of the equipment. The plate has two concentric openings to form a ledge (35) for holding the testing substrate (10). Additionally, the ledge has two asymmetrically placed locating pins (38) to allow automatic alignment of the testing substrate which has corresponding alignment holes. A latch (36) locks the plate against the head stage to securely fix the testing substrate in place so that it can make and maintain contact with a pogo pin area (26) on the head stage. The tester also has a wafer support chuck (20) upon which a semiconductor wafer (22) is placed with its active surface up. The head stage of the tester is closed so that the testing substrate contacts the active surface of the semiconductor wafer, and electrical testing may then be performed on the semiconductor wafer.

21 Claims, 5 Drawing Sheets

APPARATUS FOR HOLDING A TESTING SUBSTRATE IN A SEMICONDUCTOR WAFER TESTER AND METHOD FOR USING THE SAME

FIELD OF THE INVENTION

The present invention generally relates to semiconductor testing, and more specifically to an apparatus for holding a probe card in a semiconductor wafer tester and a method for its use.

BACKGROUND OF THE INVENTION

Semiconductor wafers are currently tested in specialized testing equipment to ensure functionality. In this testing equipment, a probe card provides the communication link between the tester and the individual circuitry on the semiconductor wafers. Specific probe cards work with specific types of circuitries on the semiconductor wafers. Therefore, a change in the type of semiconductor wafer being tested, such as from a microprocessor wafer to a memory wafer, requires a corresponding change in the probe card.

As illustrated in FIG. 1, the current mounting system provided by the equipment manufacturer requires that the probe card 10 be fixed to a theta adjust ring or pogo pin ring 12 inside the tester (not illustrated) by way of eight small screws 14. This method of mounting the probe card is highly inefficient and has many shortcomings. First, semiconductor wafer testing is performed in a clean room environment and having screws that need to be regularly screwed and unscrewed means that screwdrivers are required, which adds clutter to the clean room environment. Secondly, these screws often become stripped leaving metal shavings inside the testing equipment, which is an undesirable effect. Furthermore, replacement screws are required. Additionally, it is troublesome for a human operator to screw and/or unscrew these eight screws, because these screws are small and are often dropped during the probe card changing process. When a screw is dropped inside the equipment, the machine becomes unusable, and a technician is required to get inside the machine to locate and remove the dropped screws. Otherwise, any attempt to use the testing equipment could lead to more serious damage to the machine. Furthermore, the current mounting system is very time consuming. Assuming that no human errors are made during the change, the process can take 3 to 5 minutes. If errors are made, such as dropping the screws inside the equipment, this change time may take as long as several hours which greatly affects productivity. Yet another problem with the present probe card mounting system is that the operator must bend at an awkward angle over the equipment to remove the fastening screws. The bend angle is uncomfortable and not ergonomically correct which can lead to back pain.

Thus, a need exists for a simple and efficient way to change the probe card without encountering any of the above-mentioned problems.

DETAILED DESCRIPTION OF A PREFERRED EMBODIMENT

Generally, an embodiment of the present invention allows for a quick and easy changeover of a testing substrate within a semiconductor wafer tester/prober. The tester has a head stage that contains a defined area having pogo pins for contacting the testing substrate. The apparatus for holding the testing substrate comprises a plate that is hinged to the head stage of the tester. The plate has two concentric openings to form a ledge for holding the probe card. Additionally, disposed on the ledge are two locating pins, which are placed asymmetrically for automatic alignment of the testing substrate which has corresponding alignment holes. A latch provides the locking mechanism for the plate against the head stage to securely fix the testing substrate in place making contact with the defined area having the pogo pins. The tester also has a wafer support chuck upon which a semiconductor wafer is placed with its active surface up. The head stage of the tester is closed so that the testing substrate can contact, typically through cantilevered pins, the active surface of the semiconductor wafer, and electrical probing or testing may then be performed to determine the functionality of the individual circuitries on the semiconductor wafer.

These and other features, and advantages, will be more clearly understood from the following detailed description taken in conjunction with the accompanying drawings. It is important to point out that the illustrations are simplified, may not necessarily be drawn to scale, and that there may be other embodiments of the present invention which are not specifically illustrated.

Figure 1:
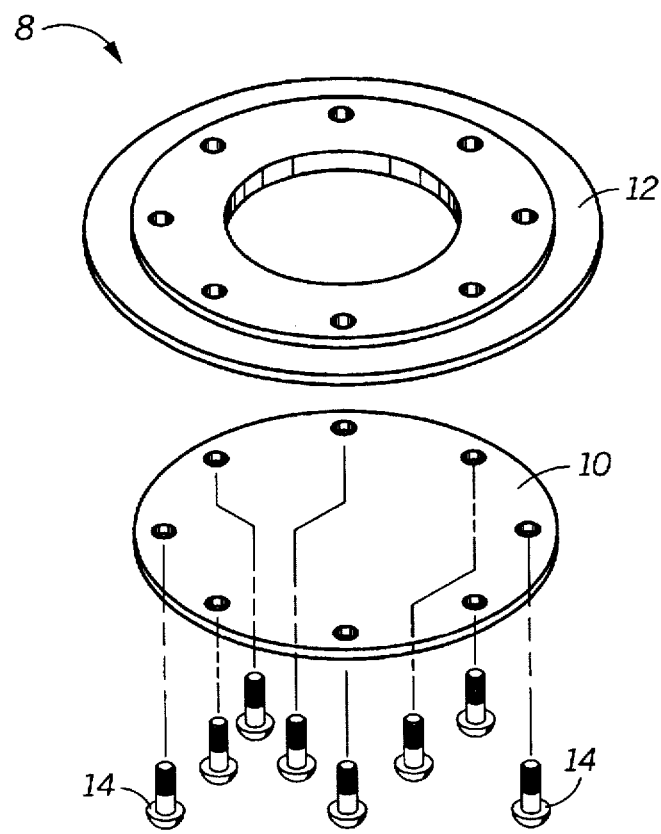
FIG. 1 illustrates, in an exploded view, the current mounting system for a probe card as known in the prior art.
Figure 2:
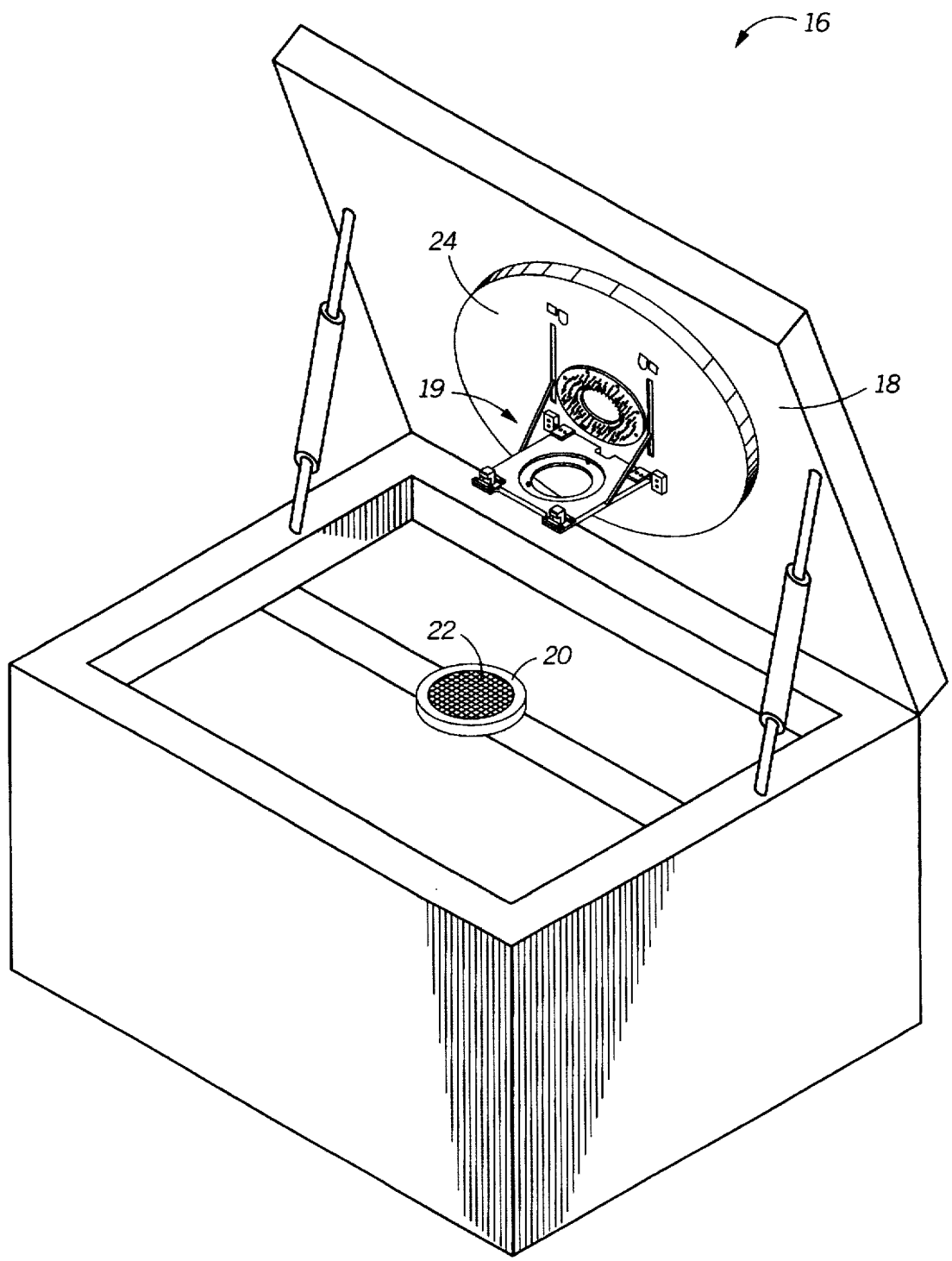
FIG. 2 illustrates, in a perspective view, a semiconductor wafer tester having an apparatus for holding a probe card in accordance with the present invention.

FIG. 2 illustrates, in a perspective view, a semiconductor wafer prober or tester 16 having an apparatus for holding a testing substrate in accordance with the present invention. It should be understood that the prober or tester 16 is greatly simplified for ease of illustration and for clarity since only the relevant parts are shown. Part of the prober 16 is a head stage 18 which is essentially a lid to the equipment box. Located on the head stage 18 is a theta adjust ring 24 which is used to rotationally align the testing substrate, typically a probe card, to the semiconductor wafer. Hinged to the theta adjust ring 24 is the apparatus 19 for holding the probe card. This apparatus 19 more clearly illustrated in FIG. 3. Inside the prober or tester 16 is a support stage or chuck 20 for supporting a semiconductor wafer 22. When the head stage 18 is closed (not illustrated), the probe card (such as that shown in FIG. 1) is able to contact with the active surface of semiconductor wafer in order for the electrical probing or testing to be performed.

Figure 3:
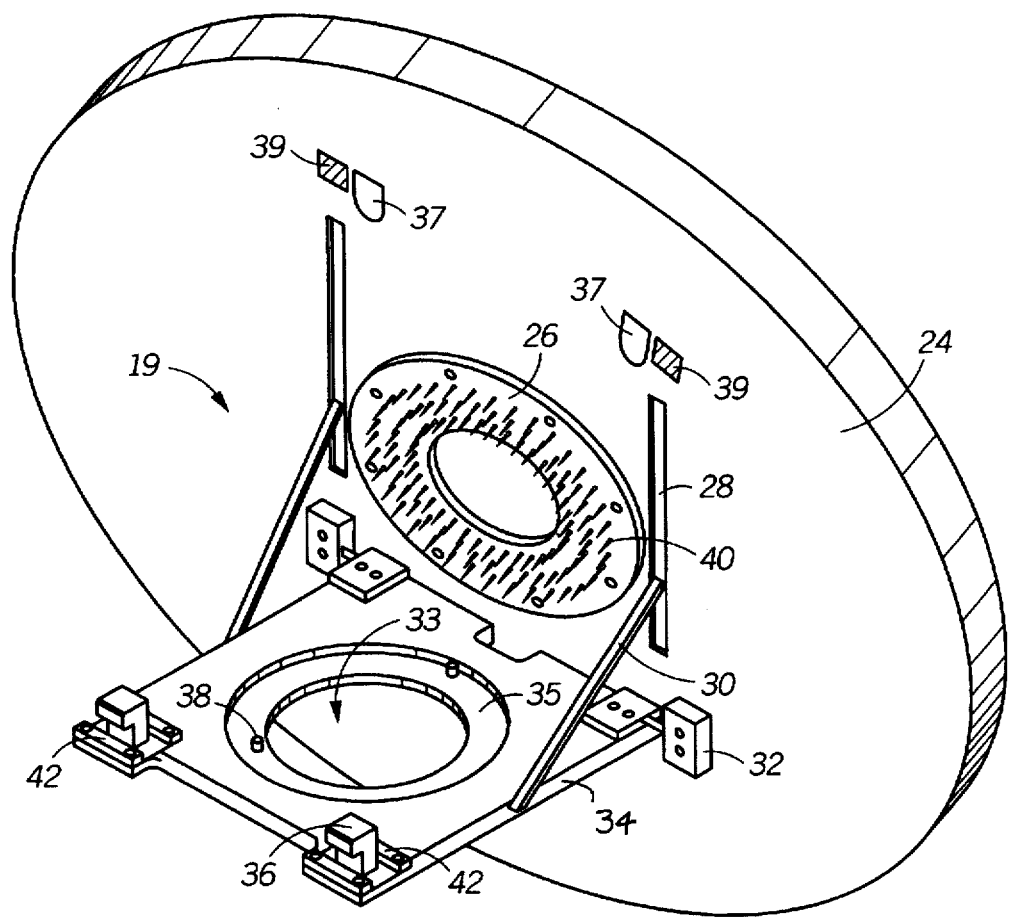
FIG. 3 illustrates, in an enlarged perspective view, the apparatus for holding a probe card of FIG. 2.

FIG. 3 illustrates, in an enlarged perspective view, the apparatus 19 for holding a testing substrate. Unless otherwise noted, tool steel may be used to make all of the elements of the apparatus 19. The theta adjust ring 24 has a defined area 26 containing a plurality of pogo pins 40 for making contact with the probe card. This defined area, also called an interface ring or a pogo pin ring, having the pogo pins is well known in the semiconductor testing equipment field since the eight screw holes (previously discussed in FIG. 1) have not been modified although they are no longer used. However, unlike the prior art method of mounting the probe card using eight screws, the present invention provides a plate 34 that is connected to the theta adjust ring 24 by hinges 32. These hinges allow the plate 34 to rotate between an open position (as shown) and a closed position, where the plate 34 would be pressed against the theta adjust ring. The slider cranks 30 constrain the motion of the plate so that the plate does not hit the theta adjust ring causing deformation or fracture of the hinge pins. The slider cranks 30 move in the slots 28 that are located in the theta adjust ring. Due to the slider cranks 30, the plate 34 cannot move in the x-y direction to prevent misalignment of the probe card, once inserted, with respect to the pogo pins 40. When the plate 34 is open to allow a changeover of the probe card, the plate makes at most a 90° angle with respect to the head stage which is itself open at approximately 70°. A suitable range of angles for the open plate to make with respect to the head stage is 45° to 90°. In this manner, the open plate is presented to the operator at an easy to view angle where the operator can simply place the probe card onto the ledge without having to bend over the equipment.

Also illustrated in FIG. 3 is a substantially central aperture 33 in the plate 34. The aperture 33 is required so that the probe card can contact the active surface of the semiconductor wafer that is supported on the chuck, as illustrated in FIG. 2. The probe card would be supported by the ledge 35 in the plate 34. The ledge 35 is formed by two concentric apertures. The first aperture is extends through a top portion of the thickness of the plate, and the second aperture extends through the remainder portion of the thickness of the plate. The lower aperture is smaller than the upper aperture to provide the support ledge 35 for the probe card. The ledge 35 should be approximately at least 3 mm (0.125 inch) in order to adequately support the probe card. Although there is no absolute upper limit on the width of the ledge, a practicable maximum width would be approximately 100 mm (4 inches). Also located on the ledge 35 are two locating pins 38 for correct placement of the probe card onto the ledge. The locating pins 38 are asymmetrically disposed on the ledge so that the probe card, which has corresponding locating holes, can only fit in one direction. This feature helps to eliminate operator error in installing a different probe card by making the alignment automatic.

Another important feature of the apparatus for holding the probe card is the latching mechanism 36 for locking the plate 34 into place once the probe card is placed on the ledge 35. The latches 36 fit into the openings 37 that are located on the theta adjust ring 24. The latches 36 are slidably movable within grooves on the plate 34. This design allows the latches, once fitted into the openings 37, to slide into an "up" position to lock the plate securely against the theta adjust ring. This locking mechanism is important because the pogo pins 40 can exert a tremendous amount of pressure against the probe card and plate to cause points or areas of non-contact which will lead to faulty test results.

Since locking of the plate against the head stage vis a vis the theta adjust ring is important, sensors 39 can be placed near the openings 37 on the theta adjust ring 24 to verify whether the latches 36 have properly engaged. In particular, fiber optic sensors have been found to work well for the intended sensing function. This feature can be set up to activate an alarm and disable the test program if a latch is not properly engaged to securely lock the plate 34 in place.

Figure 4:
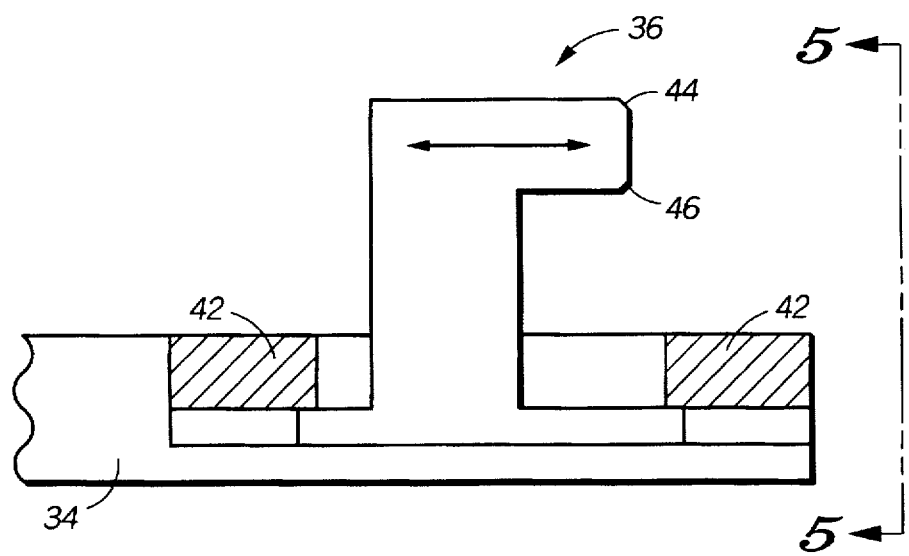
FIG. 4 illustrates, in a side view, the latching mechanism for the apparatus of FIG. 2.
Figure 5:
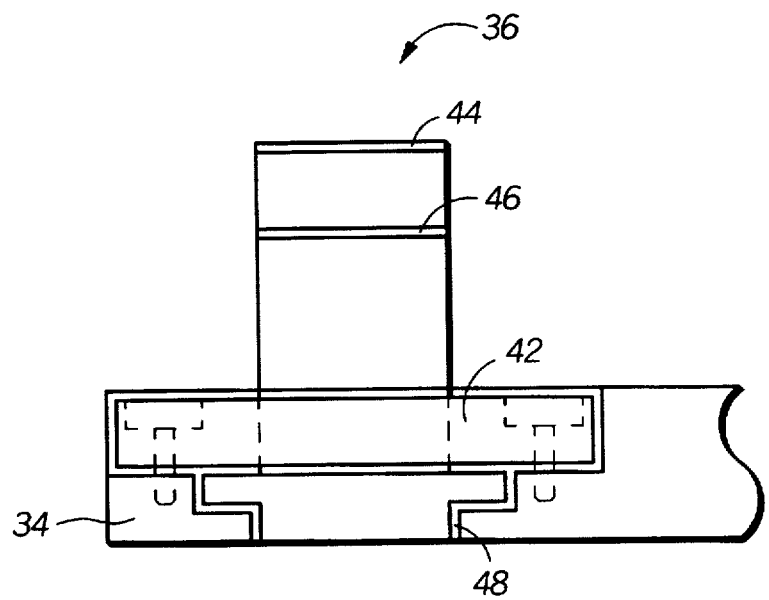
FIG. 5 illustrates, in an end view, the latching mechanism of FIG. 4.

FIGS. 4 & 5 illustrate in greater detail the latching mechanism 36, wherein FIG. 4 is a cross-sectional view while FIG. 5 is an end view. As shown, the latch 36 is attached to the plate 34 by retaining straps 42. The latch 36 is slidably movable along the direction of the arrow between a locked and an unlocked position. Additionally, a chamfer 44 located on the upper edge of the latch helps to guide the latch into the opening on the theta adjust ring. However, this chamfer 44 has another important function in removing the sharp edge that would otherwise be present, to provide for operator safety. Else, an operator could easily cut a finger or arm against the upper edge of the latch. A lead-in chamfer 46 on the lower edge of the latch allows the latch to easily connect into the opening in the theta adjust ring. This lead-in chamfer 46 is more important for the function of guidance than the upper chamfer 44 because the lower chamfer 46 would make first contact with the surface of the theta adjust ring.

As can be seen in FIG. 5, the latch 36 slides within a groove 48 in the plate 34. The bottom portion of the latch 36 is slightly smaller than the groove 48 for clearance and for ease of movement. This clearance gap should be no more than 0.005 to 0.010 inch (0.127 to 0.254 mm). Additionally illustrated are two bolts that hold the retaining strap 42 in place. However, other more permanent methods of holding the retaining strap such as welding, can also be done.

It should be appreciated that by simply requiring the operator to drop in the probe card using the locating pins on the ledge provided in the plate 34 and simply sliding the latches into a locked position, changing out probe cards for different semiconductor wafer types typically takes 30 seconds with the present invention. Moreover, since the screws have been eliminated, the problem of machine down time caused by dropped screws is also eliminated. Furthermore, there is no longer the problem of stripped screws leaving metal shavings inside the equipment or on the semiconductor wafer surface, and no replacement screws are required. Additionally, the operator no longer needs to bend over the equipment at awkward and uncomfortable angles to change probe cards since the present invention presents the plate to the operator at an appropriate angle for easy viewing and placement of the probe card.

Figure 6:
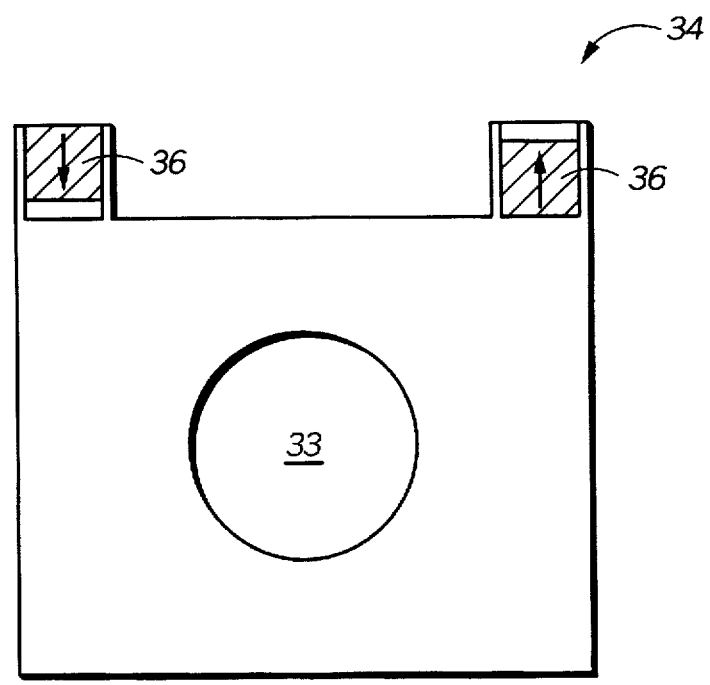
FIGS. 6-8 illustrate various alternative embodiments of the configuration of the plate for holding a probe card.
Figure 7:
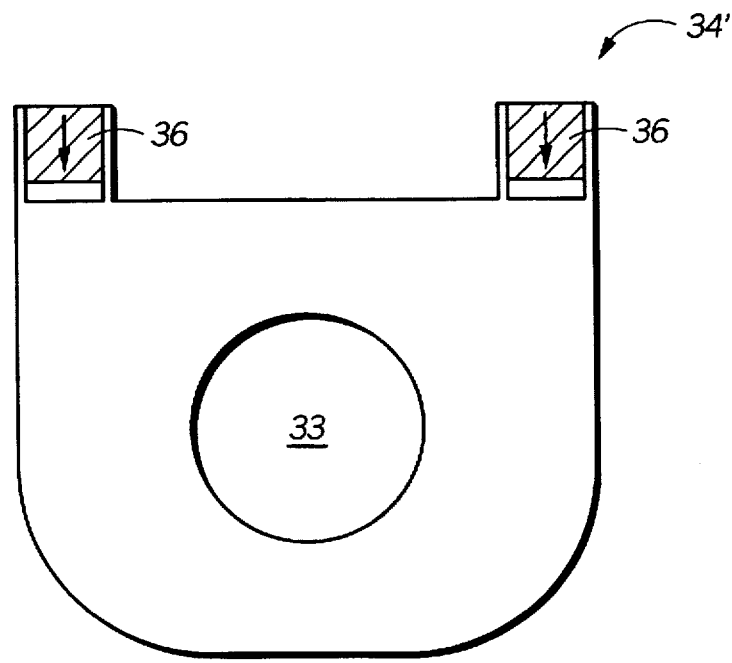
Figure 8:
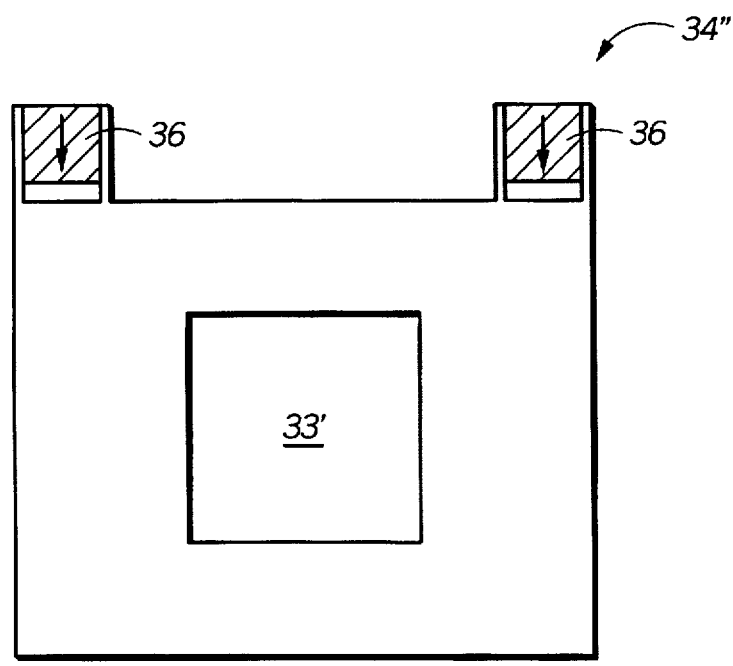

FIGS. 6–8 illustrate various alternative embodiments of the configuration of the plate for holding a probe card. The bottom side of the plates are shown, so the bottom of the latches 36 are also depicted. The arrows on the latches indicate that the latches are slidably movable between the top locked position and the bottom open position. These different embodiments are intended to show that the shape of the plate and central apertures are not limited to any particular shape. If the probe card is round or elliptical, then the central aperture should also be round or elliptical to expose the correct area on the probe card for making contact with the semiconductor wafer to be tested. Likewise, if the probe card is rectangular, then the central aperture should be of a corresponding shape. Additionally, although the plate 34 would typically be rectangular, it is not limited to the rectangular shape but can round or any other shape suitable to the geometric constraints of the testing equipment and the probe card itself.

The foregoing description and illustrations contained herein demonstrate many of the advantages associated with the present invention. In particular, it has been revealed that an apparatus for holding a probe card comprising a plate rotatably hinged to the head stage of the tester allows for a much simpler and quicker changeover of probe cards for testing of different types of semiconductor wafers. The plate is securely latched to the head stage to prevent the pogo pins from forcing the plate to open on one or both sides. An added advantage to practicing the present invention is that the means by which the probe card is held allows for uniform thermal expansion in one plane whereas the prior art method would often cause a warping of the probe card due to thermal expansion. Moreover, the screws used for mounting the probe card as known in the prior art have all been eliminated, thus eliminating all problems associated with or caused by the presence of these screws. Yet another advantage is that the present invention greatly reduces cycle time in the probe card changing process to increase productivity on the test floor.

Thus it is apparent that there has been provided, in accordance with the invention, an apparatus for holding a testing substrate for semiconductor wafer probing or testing that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the plate may be hinged to the theta adjust ring using a hook-type hinge so that the plate is removable from the theta adjust ring. In addition, the invention is not limited to any particular type of prober or tester but may be implemented on all types of probe or test equipment. It is also important to note that the present invention is not limited in any way to any particular type of semiconductor wafers. The wafers can be microprocessor devices, microcontroller devices, memory devices, bipolar devices, or any other type of devices. Therefore, it is intended that this invention encompasses all such variations and modifications falling within the scope of the appended claims.

We claim:

1. An apparatus for testing a semiconductor wafer comprising:

a semiconductor wafer tester having a wafer stage for supporting a semiconductor wafer and a test head stage;

a first plate attached to the test head stage and having a defined area for electrically contacting a probe card;

a second plate hingeably connected to the first plate, the second plate having a thickness, a first substantially central aperture through a first portion of the thickness and a second substantially concentric aperture through a remainder portion of the thickness, such that a ledge is formed within the first substantially central aperture for holding the probe card within the first substantially central aperture, at least two locating pins which are asymmetrically disposed on the ledge for alignment of the probe card; and means for locking the second plate rigidly in a closed position against the first plate, whereupon the probe card would be held in contact against the defined area on the first plate;

wherein during use of the tester the test head stage is positioned such that the probe card can make electrical contact to a semiconductor wafer on the wafer stage of the tester.

2. The apparatus of claim 1, wherein the means for locking comprises a latch slidably movable in a groove in the second plate, wherein the latch fits into an opening in the first plate such that when the latch slides from a first position in the groove to a second position in the groove, the second plate is locked against the first plate.

3. The apparatus of claim 2, wherein the latch has a lead-in chamfer on a top edge so that a sharp edge is removed for operator safety.

4. The apparatus of claim 2, wherein the latch has a lead-in chamfer on a lower edge to help guide the latch into the opening in the first plate.

5. The apparatus of claim 1, wherein the first and second apertures are round.

6. The apparatus of claim 1, wherein the first and second apertures are rectangular.

7. The apparatus of claim 1, wherein the second plate is connected to the first plate by a slider crank to limit the motion of the second plate.

8. The apparatus of claim 1, wherein the second plate is rotatably connected to the first plate, such that in an open position, the second plate makes an angle of approximately 45 degrees to 90 degrees with respect to the first plate.

9. An apparatus for holding a probe card in a semiconductor wafer prober comprising:

a first plate, serving as a head stage in the semiconductor wafer prober;

a theta adjust ring having a defined area containing a plurality of pins for contacting a probe card, the theta adjust ring being located on the first plate;

a second plate hingeably connected to the theta adjust ring, the second plate having a thickness, a first substantially central aperture through a first portion of the thickness and a second substantially concentric aperture through a remainder portion of the thickness, such that a ledge is formed within the first substantially central aperture for holding the probe card within the first substantially central aperture, at least two locating pins which are asymmetrically disposed on the ledge for aligning the probe card; and a latch for locking the second plate rigidly in a closed position against the theta adjust ring, wherein the latch is slidably movable in a groove in the second plate, such that the latch fits into an opening in the first plate so that when the latch slides from a first position in the groove to a second position in the groove, the second plate is locked against the first plate.

10. The apparatus of claim 9, wherein the first and second apertures are selected from a group of shapes consisting of elliptical and rectangular.

11. The apparatus of claim 9, wherein the second plate is connected to the first plate by a slider crank to limit movement of the second plate.

12. The apparatus of claim 9, wherein the second plate is rotatably connected to the first plate, such that in an open position, the second plate makes an angle of approximately 45 degrees to 90 degrees with respect to the first plate.

13. A method for testing a semiconductor wafer comprising the steps of:

placing a semiconductor wafer onto a support stage of a semiconductor wafer tester, the semiconductor wafer having an active surface;

placing a testing substrate onto a ledge of a plate, wherein said plate is rotatably connected to a defined area for contacting the testing substrate, the plate having a thickness, a first substantially central aperture through a first portion of the thickness and a second substantially concentric aperture through a remainder portion of the thickness to form the ledge within the first substantially central aperture, and at least two locating pins which are asymmetrically disposed on the ledge for alignment of the testing substrate;

rotating the plate having the testing substrate placed therein to lock the plate against the defined area for contacting the testing substrate to secure the testing substrate in place, wherein the defined area exerts positive pressure on the testing substrate;

bringing the testing substrate secured on the plate against the active surface of the semiconductor wafer; and performing an electrical test on the semiconductor wafer.

14. The method of claim 13, wherein the step of locking the plate is performed by engaging a latch located on the plate into an opening located on a head stage of a semiconductor wafer tester and by sliding said latch into a locked position in the opening.

15. The method of claim 14, wherein the step of locking the plate further comprises the step of verifying the locked position through a fiber optic sensor located near the opening.

16. The method of claim 14, wherein the step of engaging the latch into the opening is facilitated by a lead-in chamfer located on a lower edge of the latch.

17. The method of claim 13, wherein the step of placing the semiconductor wafer is further characterized as placing a wafer containing microprocessor devices onto the ledge.

18. The method of claim 13, wherein the step of placing the semiconductor wafer is further characterized as placing a wafer containing memory devices onto the ledge.

19. The method of claim 13, wherein the step of placing the semiconductor wafer is further characterized as placing a wafer containing microcontroller devices onto the ledge.

20. The method of claim 13, wherein the step of placing the semiconductor wafer is further characterized as placing a wafer containing bipolar devices onto the ledge.

21. The method of claim 13, wherein the plate is connected to the defined area via a slider crank, and during the step of rotating, the slider crank limits movement of the plate with respect to the defined area.

* * * * *